April 7, 1959 O. R. MILLER 2,881,266

HIGH IMPEDANCE INPUT CIRCUIT AMPLIFIER

Filed June 26, 1953 7 Sheets-Sheet 1

INVENTOR
O. R. MILLER
BY
Walter M. Kiel
ATTORNEY

INVENTOR
O. R. MILLER
BY
Walter M. Hill
ATTORNEY

HIGH IMPEDANCE INPUT CIRCUIT AMPLIFIER

Filed June 26, 1953

INVENTOR
O.R. MILLER
BY
Walter M. Hiel
ATTORNEY

April 7, 1959 O. R. MILLER 2,881,266

HIGH IMPEDANCE INPUT CIRCUIT AMPLIFIER

Filed June 26, 1953 7 Sheets-Sheet 4

INVENTOR
O. R. MILLER
BY
Walter M. Hill
ATTORNEY

INVENTOR
O. R. MILLER
BY
Walter M. Hill
ATTORNEY

INVENTOR
O. R. MILLER
BY Walter M. Hill
ATTORNEY

April 7, 1959 O. R. MILLER 2,881,266

HIGH IMPEDANCE INPUT CIRCUIT AMPLIFIER

Filed June 26, 1953 7 Sheets-Sheet 7

INVENTOR
O. R. MILLER
BY Walter M. Hill
ATTORNEY

United States Patent Office 2,881,266
Patented Apr. 7, 1959

2,881,266

HIGH IMPEDANCE INPUT CIRCUIT AMPLIFIER

Ohmer R. Miller, Morristown, N.J., assignor to Bell Telephone Laboratories, Incorporated, New York, N.Y., a corporation of New York Application June 26, 1953, Serial No. 364,409

12 Claims. (Cl. 179—171)

This invention relates to amplifier circuits and more particularly to a circuit means for obtaining, over a substantial range, any desirable high input resistance whether it be of positive, of negative or of infinite value.

In the development of certain modern electronic apparatus it is frequently necessary to measure the static potentials of charged dielectric material, the static potentials of condensers or the static potential of an electret. Other problems frequently faced are that of measuring the electromotive force of a very high resistance source and especially the problem of measuring the electromotive force of such a source through an ordinary test cable which has a finite leakage resistance. If the input resistance of an amplifier, especially of a direct-current amplifier can be adjusted through infinite resistance or can be made negative, these problems can be easily solved.

It is the object of this invention to provide a circuit means adaptable for adjusting the input resistance of an amplifier so as to enable it to present to the input source any desirable high input resistance.

The foregoing object is achieved by this invention which provides a feedback circuit for a direct-coupled amplifier which drives both the anode and the cathode of the input stage at a potential which varies in the same sense as the potential which is applied to the input grid of that stage. By controlling the magnitude of this feedback, the input resistance can be made positive, infinite or negative over a substantial range.

Figure 1:
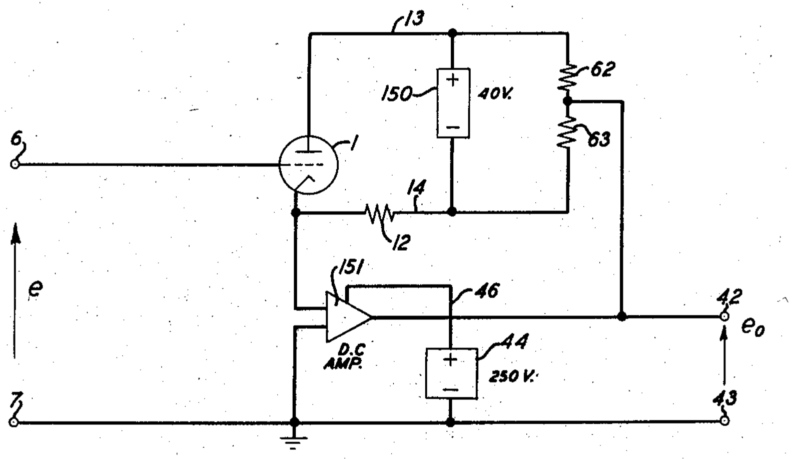
Figure 2:
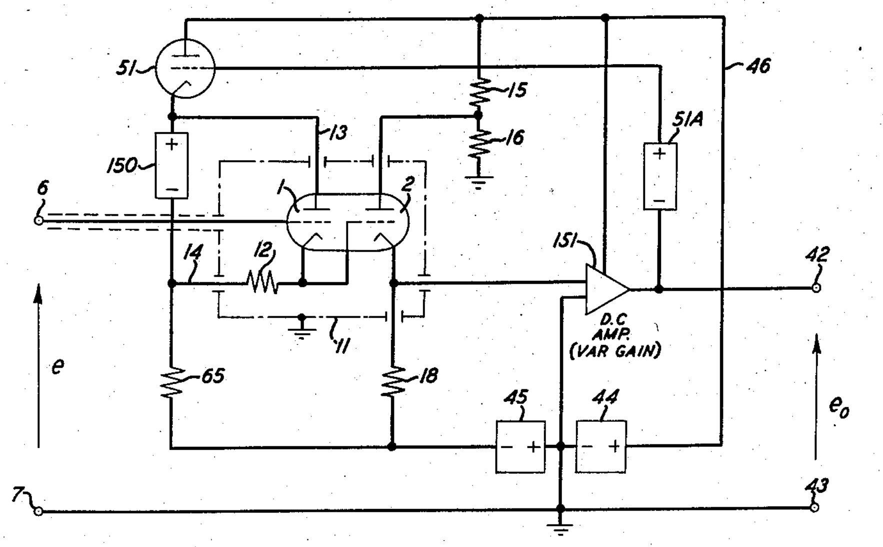
Figure 3:
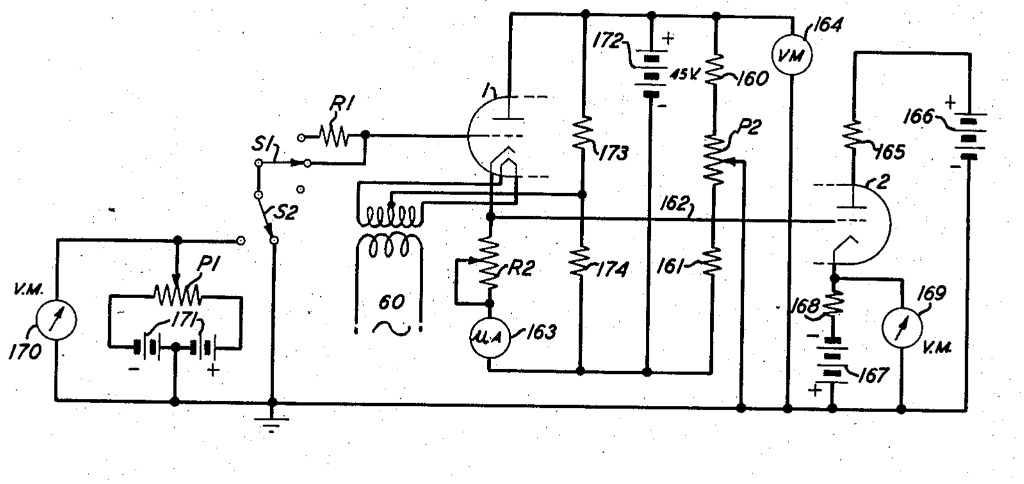
Figure 4:
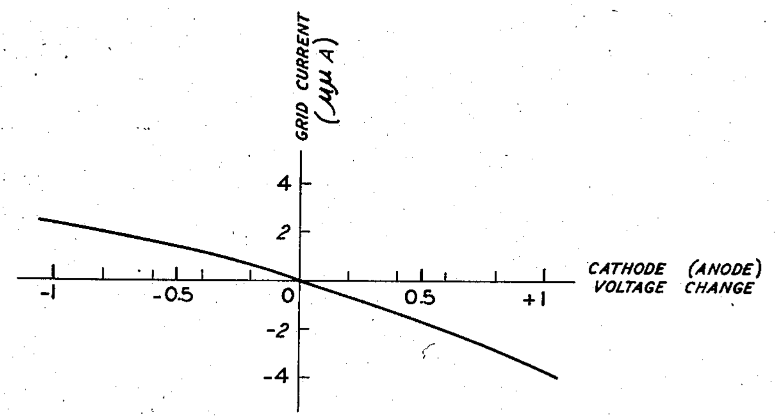
Figure 5:
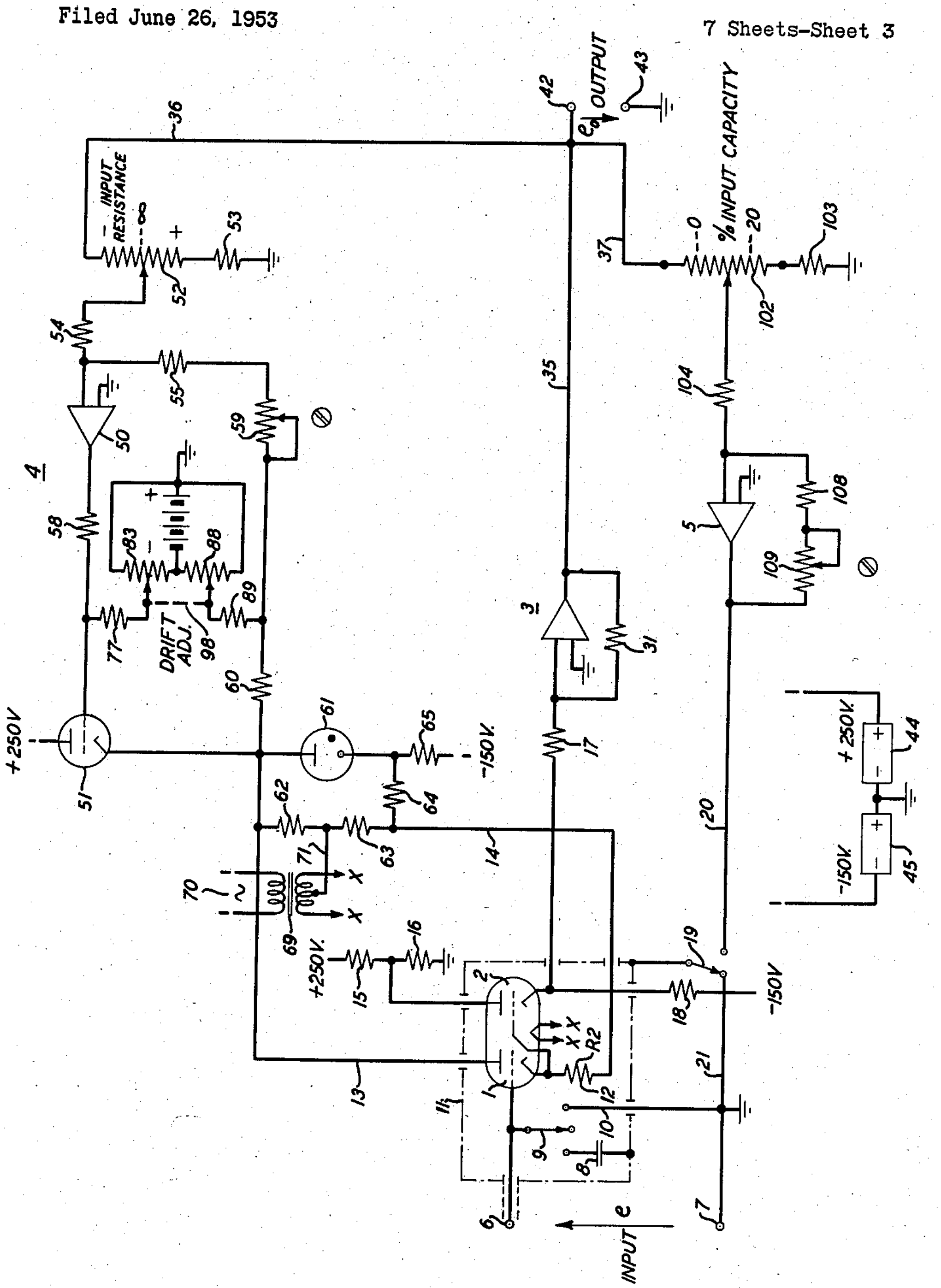
Figure 10:
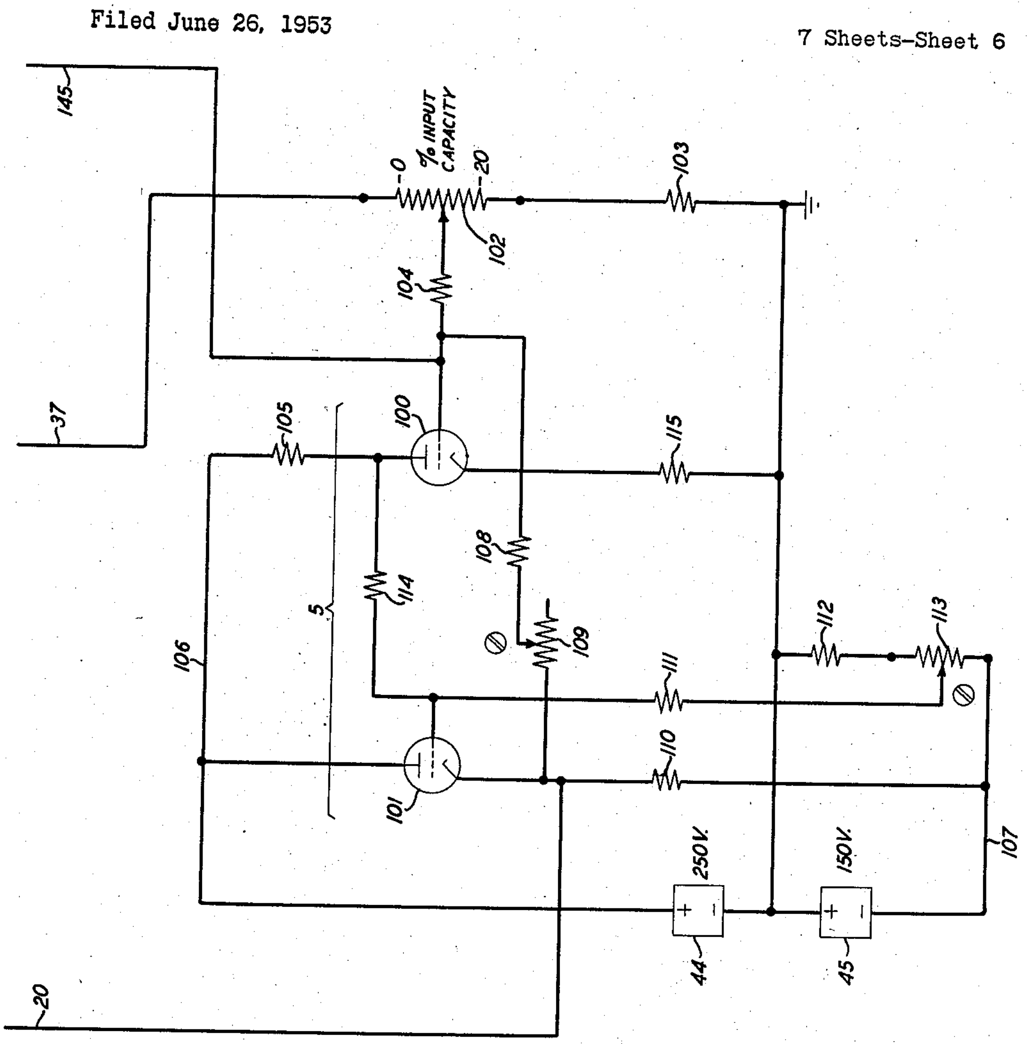

The invention may be better understood by referring to the accompanying drawings in which:

Fig. 1 is illustrative of an embodiment of the invention in a greatly simplified form;

Fig. 2 discloses another simplified embodiment of the invention;

Fig. 3 discloses a measuring circuit suitable for determining the input resistance properties of a vacuum tube and for determining the suitability of the tube for the practice of this invention;

Fig. 4 is a curve illustrating a grid current characteristic of a typical vacuum tube which may be used in the practice of this invention;

Fig. 5 discloses another embodiment of the invention including means for overcoming the effect of input capacity when the input is either an alternating voltage or a varying direct voltage;

Figs. 6, 7, 8 and 9 disclose the complete circuits of one embodiment of the invention which provides both resistance and capacity control for the input circuit and a convenient metering arrangement for adjusting the circuit for proper operation; and Fig. 10 shows the proper arrangement for assembling Figs. 6 to 9 inclusive.

Referring now to Fig. 1 it will be noted that vacuum tube 1 is disclosed as a triode with its grid connected to an input terminal 6. The anode and cathode of the tube are connected to a source of fixed potential 150, the cathode being connected to the negative terminal of the source through a resistor 12 and conductor 14. An amplifier 151 has an input circuit connected to the cathode of tube 1 and an output circuit connected to the source of fixed potential 150 through resistors 62 and 63 and to an output terminal 42 which, together with a terminal 43, may comprise the output terminals of the amplifier system. These terminals may be connected to any suitable load for utilizing the output voltage of the amplifier, as for example, a meter circuit, another amplifier, or some useful load. A conductor, common to both the input circuit and the output circuit of amplifier 151, is connected to ground and to terminals 7 and 43. Power is supplied to amplifier 151 from source 44. Sources 150 and 44 may have voltages in the order of 40 volts and 250 volts, respectively.

In explaining the operation of this circuit one may consider first that the circuits are so adjusted that with zero potential between terminals 6 and 7, zero output potential will exist between terminals 42 and 43. It may also be assumed, for present purposes, that resistors 12, 62 and 63 are so chosen that when the input potential is zero between terminals 6 and 7 no grid current will flow. This zero grid current condition, if maintained over an appreciable input voltage range, will represent an infinite input resistance looking into the amplifier input circuit from input terminals 6 and 7.

It has been found that the infinite resistance circuit condition described in the preceding paragraph may be maintained over a substantial range of input voltages provided that the potentials of both the anode and the cathode of tube 1 are caused to vary in the same sense and by the same amount as the applied input potential which causes the grid potential to change. This is accomplished by the positive feedback circuit from amplifier 151. All potentials, unless otherwise stated, are referred to ground. The output circuit of the amplifier is connected to the anode of tube 1 and to the positive terminal of the source of fixed potential 150 by way of resistor 62 and conductor 13. The anode-cathode space current in tube 1 will remain substantially constant provided that the potential difference between the grid and the cathode remains substantially fixed. Consequently, the potential drop across resistor 12, which may be in the order of five megohms, remains substantially unchanged. The effect of the positive feedback is, therefore, to cause the anode and the cathode of tube 1, together with resistor 12 and source 150 to change potential in the same sense and by the same amount that the applied voltage causes the grid to change.

It will also be apparent that if the positive feedback is not quite large enough to cause the system, comprising the fixed voltage source 150 and the anode and cathode of tube 1, to change in potential by the same amount as the grid voltage changes, some grid current will flow depending upon how much the potential of this system differs from the grid potential. This will cause the input circuit to appear to have a positive resistance since the current will flow through the grid circuit in the same direction as the impressed input voltage between terminals 6 and 7. This effect is accomplished by providing amplifier 151 with a gain slightly smaller than necessary to maintain the infinite input resistance condition.

On the other hand, if amplifier 151 is provided with more gain than is necessary to maintain the infinite input resistance condition, the system comprising the anode and cathode of tube 1 and the fixed potential source 150 will change in potential by an increment greater than the potential change of the grid. This will cause the grid to supply current to the source connected to terminals 6 and 7 so that the input circuit will appear to have a negative resistance. In other words, the current flow through the grid circuit is in a direction opposite to the polarity of the applied input potential.

From the foregoing discussion it is evident that the input resistance provided by tube 1 may be caused to have most any value, positive or negative, by simply adjusting the gain of amplifier 151. It is preferred that amplifier 151 be capable of transmitting direct currents so that the effect described may be utilized for direct currents as well as for alternating currents.

In Fig. 2 the circuit is somewhat similar to that of Fig. 1 except that a cathode follower stage 2 has been interposed between input tube 1 and amplifier 151. A shield 11 has also been provided around tubes 1 and 2 to prevent disturbances due to capacity effects from nearby circuits. This shield is preferably carried out to terminal 6 as shown. Tube 2 may comprise one section of a single envelope which also includes the tube elements of tube 1. The plate circuit of tube 2 is provided with power from sources 44 and 45 by way of conductor 46 and potential divider resistors 15 and 16. The cathode of this tube is provided with a resistor 18 connected to the negative terminal of source 45 and the grid is connected directly to the cathode of tube 1.

Fig. 2 also shows another cathode follower amplifier 51 which serves to couple the output resistor 65 to the output circuit of amplifier 151. The potential of the cathode of tube 51 may be normally about 20 volts positive so a suitable bias source 51A is connected to the grid to establish a proper grid potential. The source of constant potential 150 and the anode and cathode of tube 1 are connected to the cathode of tube 51 so their potential changes will be those of the cathode of tube 51. For convenience, it may be considered that tube 2, amplifier 151 and tube 51 comprise a single amplifier system which is connected to an input coupling tube comprising tube 1.

The circuit shown in Fig. 2 operates in substantially the same manner as previously described for Fig. 1. The circuit parameters are so chosen that, with a zero voltage between the input terminals 6 and 7, a zero voltage exists between output terminals 42 and 43. It is also understood that the remaining circuit parameters are so selected that, for a particular gain adjustment of amplifier 151, no grid current will flow in the input section of tube 1 when a small potential of either polarity is applied between the input terminals 6 and 7. With these adjustments in mind, it will be apparent that tube 1 will present a substantially infinite input impedance to a source of electromotive force connected to the input terminals.

In order to determine the suitability of a vacuum tube for use as tube 1 in the practice of this invention, this tube may be connected into a circuit such as shown in Fig. 3. In this figure, tube 1 is supplied with plate current from a source 172 in series with variable resistor R2 and microammeter 163. Also connected across source 172 are two resistance paths comprising for one path resistors 160, 161 and potentiometer P2 and for the other path resistors 173 and 174. The slider of potentiometer P2 is connected to ground. The junction of resistors 173 and 174 is connected to the midpoint of the heater transformer for tube 1. This minimizes the potential difference between the cathode and its heater and also provides a convenient means for causing the heater circuit potential to ground to vary the same as the anode and cathode potentials when potentiometer P2 is adjusted. While not limited to these values, resistors 160 and 161 may each be of the order of 20,000 ohms, potentiometer P2 may have a resistance of about 50,000 ohms and variable resistor R2 may be adjustable through a resistance in the order of 5 megohms. The anode potential of tube 1, to ground, may be conveniently measured by a voltmeter 164. The cathode voltage, with respect to ground, is applied to the grid of a tube 2 which may be included in an arm of a balanced vacuum tube voltmeter circuit. This meter circuit may be of most any conventional type but, as shown, it comprises two voltage sources 166 and 167 connected in series with resistors 165 and 168 and the anode-cathode space path of tube 2. A voltmeter 169 may be connected between the cathode and the grounded junction between the two voltage sources. This meter need not be calibrated but it should be sensitive to small voltage changes applied between the grid of tube 2 and ground so as to indicate small potential changes of the cathode of tube 1 with respect to ground.

The grid of tube 1 is connected to a high resistance R1 which may be in the order of 10,000 to 100,000 megohms, the exact value of which should be known if actual values of grid current are to be obtained. A switch S1 is arranged for connection to the grid of tube 1, either through resistor R1 or by direct connection. Another position of this switch is provided for opening the grid circuit altogether. The brush of switch S1 is preferably connected to the brush of another switch S2 which may be connected either to ground or to the slider of a potentiometer P1. Potentiometer P1 is in turn connected across a center-tapped voltage source 171, the center tap of which is connected to ground. A voltmeter 170 may be connected between ground and the slider of potentiometer P1. It will be evident that this voltmeter will indicate the potential existing between the slider and ground. This potential may be varied by moving the slider in either direction along the potentiometer resistance to provide either positive or negative known voltage increments for the grid of tube 1.

It will be remembered that if no grid current flows in tube 1 due to an impressed potential applied to the grid, the grid circuit is said to have an infinite resistance. This occurs for a selected pair of anode and cathode potentials which must be experimentally determined. It will also be remembered that for a different pair of anode and cathode potentials, the grid current may be caused to flow in the direction of an applied input potential so that the grid circuit is said to possess a positive resistance. If the current flows in the opposite direction, that is against the applied potential, the input resistance is conventionally considered negative. If, after having adjusted the anode and cathode potentials to their proper values for zero grid current, the anode, cathode and heater circuit potenials are caused to maintain substantially the same values relative to the grid potential, the grid current will continue to remain substantially zero even though the grid potential is varied over a normal signal range. As already explained and as will be more fully described later, this condition will obtain when the anode, cathode and heater circuit potentials simultaneously vary by the same amount and in the same direction as the grid potential.

The zero grid current conditions for tube 1 are obtained for design purposes from the circuit of Fig. 3 by grounding the grid through switches S1 and S2. Resistor R2 is adjusted to give the desired cathode current as read by meter 163. Then potentiometer P2 is gradually operated while intermittently opening and closing the grid circuit with switch S1. When potentiometer P2 has established the anode and cathode potentials which result in no change in the deflection of meter 169 as the grid is alternately opened and grounded, the zero grid current conditions for zero grid voltage are established. The anode potential is determined directly by meter 164. The cathode potential is obviously the sum of the anode potential and the drop across resistor R2, less the voltage of source 172.

For a given pair of anode and cathode potentials thus selected for the zero grid current condition, it must also be determined whether or not the tube characteristics are such as to permit the tube to also act as an amplifier over a reasonable range of input potential change. That is, the conditions for zero grid current should be such as to be within the amplifying range of the tube. This latter condition is conveniently determined for a given zero grid current condition by using the circuit of Fig. 3. The grid is connected to the slider of P1 through switches S1 and S2 and the slider is operated over a desired signal range, for example a range of plus or minus 5 volts. If meter 169 indicates a continuous, substantially linear change throughout this range, tube 1 is operating within its amplifying range.

The circuit of Fig. 3 is also useful in obtaining the curve of Fig. 4. Resistor R2 is adjusted to some fixed value, as for example 5 megohms. The anode and cathode potentials of tube 1 are simultaneously changed by equal increments by moving the slider of potentiometer P2 until there is no change in indication on voltmeter 169 when the grid of tube 1 is intermittently connected to ground through switches S1 and S2. This latter condition is the condition of zero grid current. Since both the anode and the cathode potentials change the same amount and in the same direction, the voltages along the abscissa of the curve apply to both electrodes. Under the assumed conditions, the cathode current as read by meter 163 is usually in the order of 5 microamperes, if the tube used is a 6SN7 vacuum tube and the voltage of source 172 is about 45 volts. The potential of the anode of tube 1 to ground is measured by meter 164. This potential is varied over a small range of plus or minus one volt by moving the slider of potentiometer P2 and the grid current flowing through the grid circuit of tube 1 is computed from the voltage drop across resistor R1. For each small change in anode and cathode voltage from the zero grid current condition and with the grid grounded through switches S1 and S2, the deflection of meter 169 is noted after which switch S1 is moved to its upper position to include resistor R1 in series with the grid. Potentiometer P1 is then varied until meter 169 returns to the same deflection. Meter 169 thus indicates the condition where the grid is again at ground potential so that the voltage reading of meter 170 represents the voltage across resistor R1. The ratio of the voltage indicated by meter 170 to the resistance of resistor R1 determines the amount of grid current which is plotted on the curve of Fig. 4.

It will be observed that the curve of Fig. 4 is not a straight line. The amount of curvature varies with different tubes. It has been found that if there is any appreciable leakage from the heater to either the grid or the cathode, this curvature becomes more pronounced. Tubes which show the least leakage generally have a more linear curve and are better adapted for use as the input tube 1 of this invention. Assuming for the moment that this curve is linear, it will be evident that if the gain of amplifier 151 of Figs. 1 and 2 is lowered to cause the input circuit to have a positive resistance, this resistance will be constant regardless of the value of the input voltage applied to the grid of tube 1. This is because the departure of the anode and cathode potentials from their values at zero grid current is proportional to the applied input voltage, it being remembered that the feedback circuit drives the anode and cathode potentials in this manner. Now, if the curve of Fig. 4 is straight, the ratio of voltage change to grid current is constant and hence the input resistance is constant. Slight curvature in this characteristic causes the resistance to be somewhat different for different voltages. For ordinary work, this may be neglected and the gain control may be calibrated in terms of input resistance as is more fully described below in connection with Figs. 5 and 6. If the curvature cannot be neglected, calibration must be made for each input voltage.

Fig. 5 discloses a simplified schematic of a practical embodiment of the invention and incorporates, along with means for controlling the input resistance, an independent means for controlling the effective input capacitance presented by the grid circuit of tube 1. Here again tubes 1 and 2 are enclosed in an electrostatic shield 11 which may either be connected to ground or to a capacitance control circuit by operating the two-position switch 19. A switch 9 is also provided within the shield for connecting the grid to ground through conductor 10 or to the shield through a capacitor 8. The grid is grounded when adjusting other portions of the circuit. Capacitor 8 provides additional input capacitance where that is desired. The circuits of tubes 1 and 2 are essentially identical with those previously described in Fig. 2 and it will be noted that the same reference numerals have been used for corresponding parts of both figures.

The source of constant potential is provided in this circuit by means of a gaseous regulator tube 61 across which is connected a potential divider circuit 62, 63, 64, the resistances of which are all very small compared with the resistance of resistor 12. It will be understood that this circuit arrangement will provide a substantially constant potential between conductors 13 and 14. Resistors 62 and 63 are preferably made equal and the junction is connected by way of conductor 71 to the center tap of the heater winding in transformer 69 which provides current to the heater of tubes 1 and 2. It will thus be evident that a fixed potential difference will be also maintained between the heater and the cathodes within the tube.

The output of cathode follower tube 2 is connected to an amplifier 3 through a series resistor 17. Amplifier 3 is provided with a feedback resistor 31 so as to stabilize its gain. The output of amplifier 3 is connected to output terminal 42 by way of conductor 35. Conductor 35 is also connected to the input circuits of an amplifier 4 by way of conductor 36. Amplifier 4 may comprise a shunt feedback type amplifier 50 and a cathode follower stage 51. The output resistance for tube 51 is provided by the resistor 65 which is connected to the negative terminal of source 45 shown separately at the bottom of the figure. The anode of tube 51 is connected to the positive terminal of source 44, also shown at the bottom of the figure.

The gain of amplifier 4 may be varied by varying the resistance of the feedback circuit comprising resistor 60, a variable resistor 59 and resistor 55. The gain of this amplifier may also be varied by adjusting the input potentiometer 52. The manner in which these adjustments are made will be described in greater detail later.

The output conductor 35 from amplifier 3 is also connected to a potentiometer 102 by way of conductor 37. A resistor 103 may be connected in series with potentiometer 102 to provide a suitable adjustment range for the potentiometer. The slider of potentiometer 102 is connected to amplifier 5 by way of series resistor 104. This amplifier is also of the shunt feedback type and the feedback circuit comprises series resistors 108 and 109, the latter being adjustable in order to adjust the gain of the amplifier. Here again it will be noted that the amplifier gain can be also adjusted by the input potentiometer 102. The output of this amplifier is connected to a point on switch 19 by way of conductor 20. This output is used for driving the shield 11, so as to reduce the effect of the input capacitance of the shield. The gain of amplifier 5 can be adjusted to completely eliminate this capacitance effect although ordinarily greater circuit stability is obtained if it is not quite all eliminated.

In view of the fact that the amplifiers employed are preferably all of the direct-coupled type, some grid current drift may occur from time to time caused by a small drift in the anode and cathode potentials of tube 1. This may be very quickly corrected by means of a drift control 98 provided by a pair of ganged potentiometers 83 and 88 connected into the grid circuits of tube 51 and amplifier 50. The sliders of these two potentiometers are connected through resistors 77 and 89, resistor 77 being connected directly to the grid of tube 51 and resistor 89 to the junction between resistor 60 and variable resistor 59 in the feedback path. It will be evident that when these ganged poteitnometers are simultaneously adjusted, a slight change in bias is injected into the grid-cathode circuit of tube 51, thus changing the potential drop across cathode resistor 65. This produces equal changes in the potentials of the anode and cathode of tube 1 with respect to their grid. An opposite bias is also injected into the feedback path to amplifier 50.

The apparatus of Fig. 5 may be set up and adjusted for operation by employing well-known laboratory apparatus and techniques. The procedure will become more easily understood after reading the description of the apparatus of Figs. 6 to 9. In making these adjustments, the following requirements should be observed. With the drift control 98 centered, the grid of tube 1 is intermittently grounded and opened by switch 9. The output voltage between terminals 42 and 43 will remain zero during this operation provided proper zeroing adjustments are made. This condition should prevail even though the two gain controls 52 and 102 or gain control 59 in amplifier 4 are moved throughout their ranges. As will be more apparent later, this zero condition may be accomplished by adjusting the static bias of the tubes in amplifiers 3, 4 and 5.

Then, with the input to amplifier 4 grounded and a known voltage applied to the input terminals 6 and 7, amplifier 3 is adjusted to provide a gain of unity from the input of tube 1 to the output terminals 42 and 43. This adjustment is preferably made by adjusting feedback resistor 31 of amplifier 3.

The gain of amplifier 4 must also be set to unity by adjusting feedback control 59 while gain control 52 is at its mid position.

Amplifier 5 is similarly adjusted to unity gain by means of gain control 109, this adjustment being made with potentiometer 102 near its upper end.

With the system of Fig. 5 adjusted as just described it will be apparent that the mid position of gain control 52 corresponds to an infinite input resistance for the grid circuit of tube 1. This is due to the fact that the zero adjustments for amplifiers 3 and 4 were such as to establish the proper potentials for the anode and cathode of tube 1 so the grid current will be zero. This was evidenced by no drift from the zero output voltage when the grid of tube 1 was ungrounded. An adjustment of potentiometer 52 for less gain will cause the grid circuit of tube 1 to have a positive resistance while a negative resistance results from an adjustment for more gain. A suitable resistance scale may be inscribed on this potentiometer as symbolically indicated in Fig. 5.

Similarly, the upper position of potentiometer 102, corresponding with unity gain, will cause amplifier 5 to maintain the shield 11 at grid potential, thereby eliminating all the input capacitance to tube 1. This point on the potentiometer is inscribed with a zero. Adjustments of this potentiometer for less gain gradually increases the effective input capacitance and a scale on this potentiometer may be inscribed in terms of capacitance units or in terms of percent of some predetermined capacitance.

Should small drifts from the zero grid current condition occur, the drift control 98 will change the bias of tube 51 sufficiently to restore the required zero condition.

Figure 8:
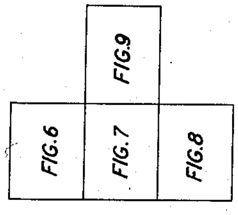
Figure 9:
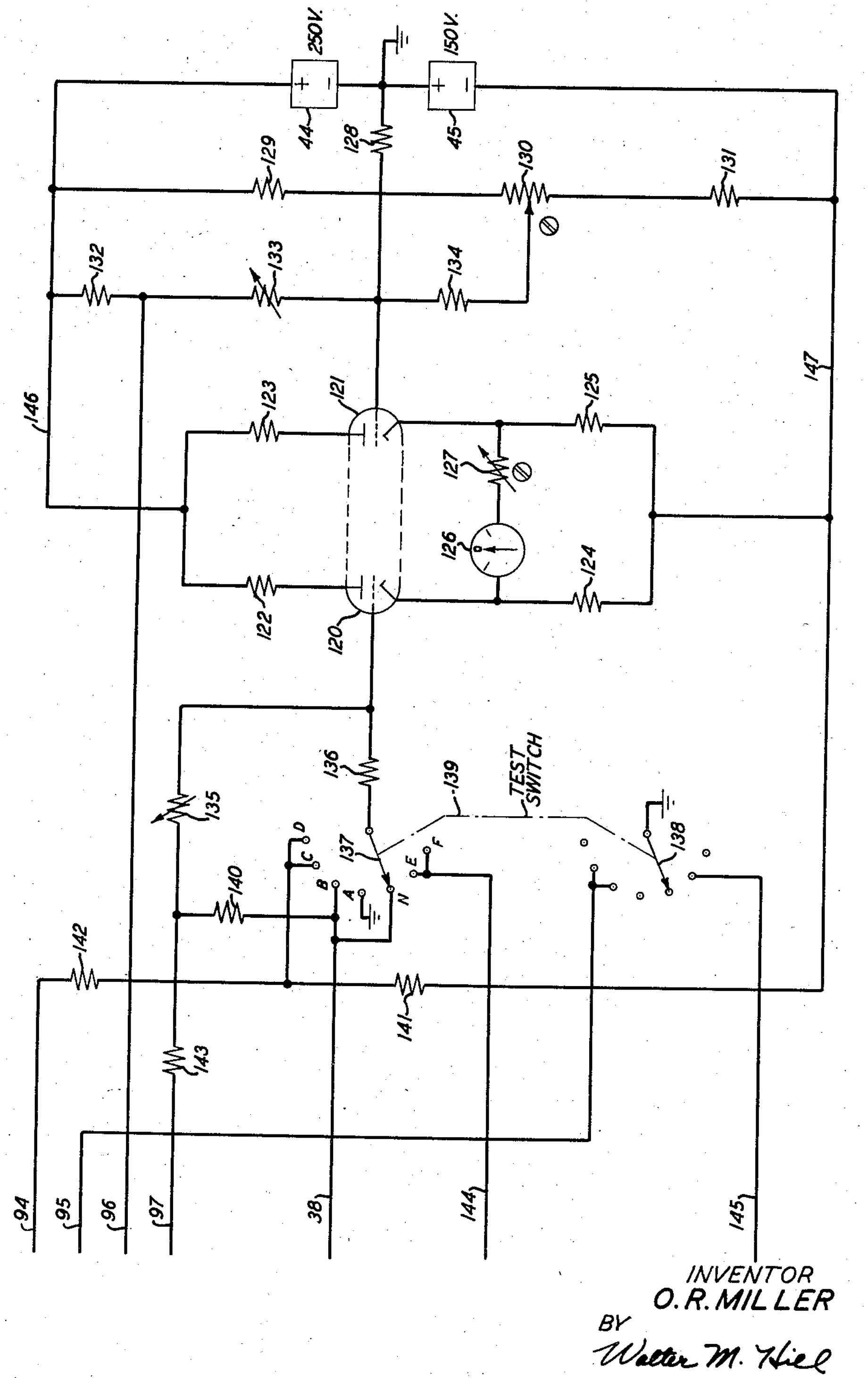

Figs. 6 to 9, inclusive, disclose an embodiment of the invention in full circuit detail. These figures should be arranged as shown in Fig. 10. It will be noted that many of the circuit components bear the same reference numerals as their corresponding components of the previous figures. It will also be noted that the circuit layout is arranged in a manner similar to that shown in the simplified schematic in Fig. 5. For convenience, power sources 44 and 45 have been shown in each of the figures whereas only one of each is actually required. Certain outstanding differences, however, may be pointed out and these include the addition of tube 27 between output terminals 42, 43 and conductors 35, 36 and 37. This stage serves as a buffer stage between the tube 26 and the output circuit of amplifier 3. Also, the circuits in Fig. 9 show a convenient voltmeter and switching arrangement adapted to assist in the routine adjustment and alignment of the various circuit components shown in Figs. 6, 7 and 8. Resistor 127 is connected in series with meter 126 to provide a means for calibrating the meter to read the voltage applied to the input terminal 6 of Fig. 7. With switch 139 set on position N, the amplifier of this invention also provides the vacuum tube voltmeter with a conveniently adjustable input impedance. The meter can then be used as a sensitive instrument for measuring electromotive forces in high impedance circuits.

Figure 6:
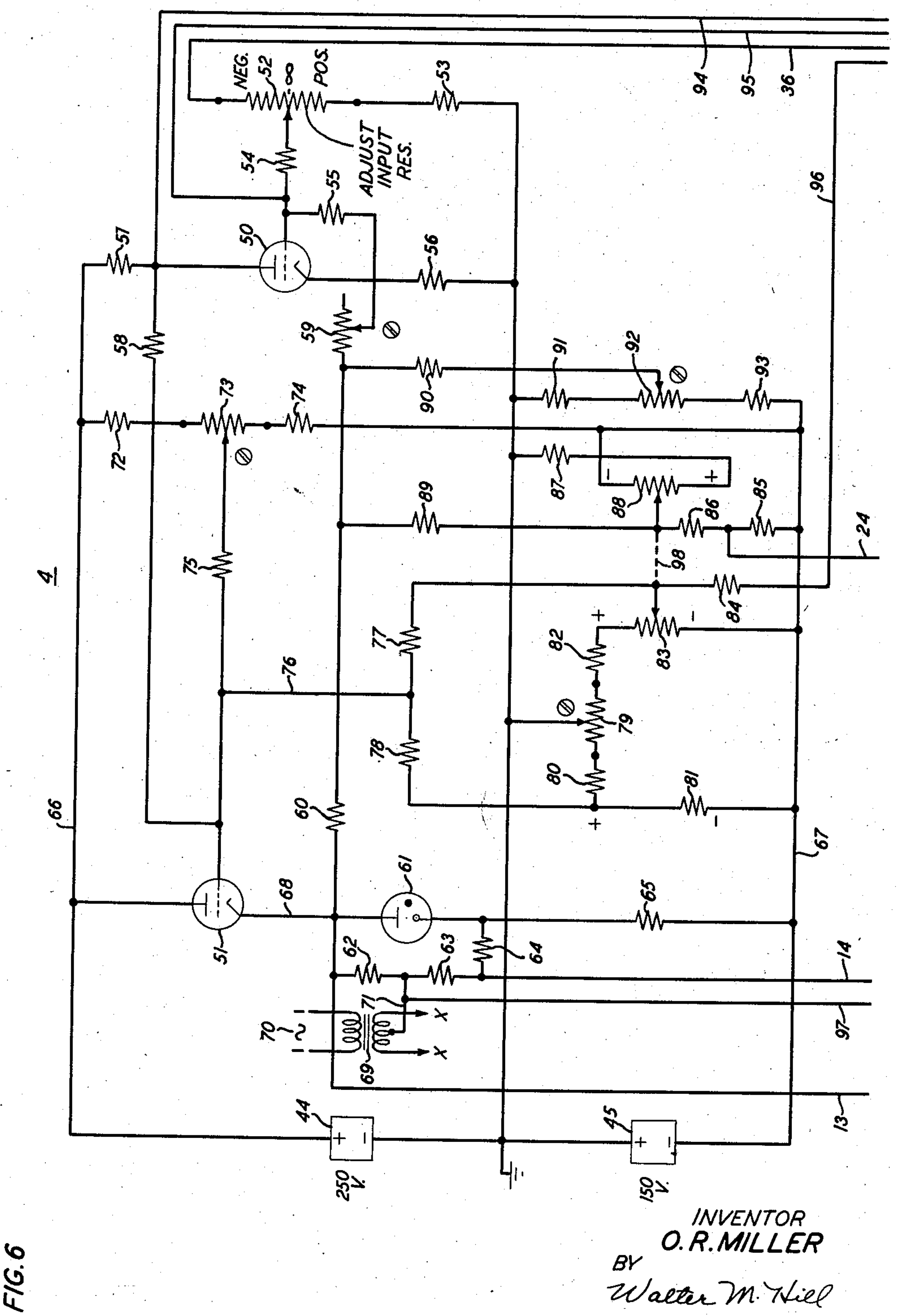
Figure 7:
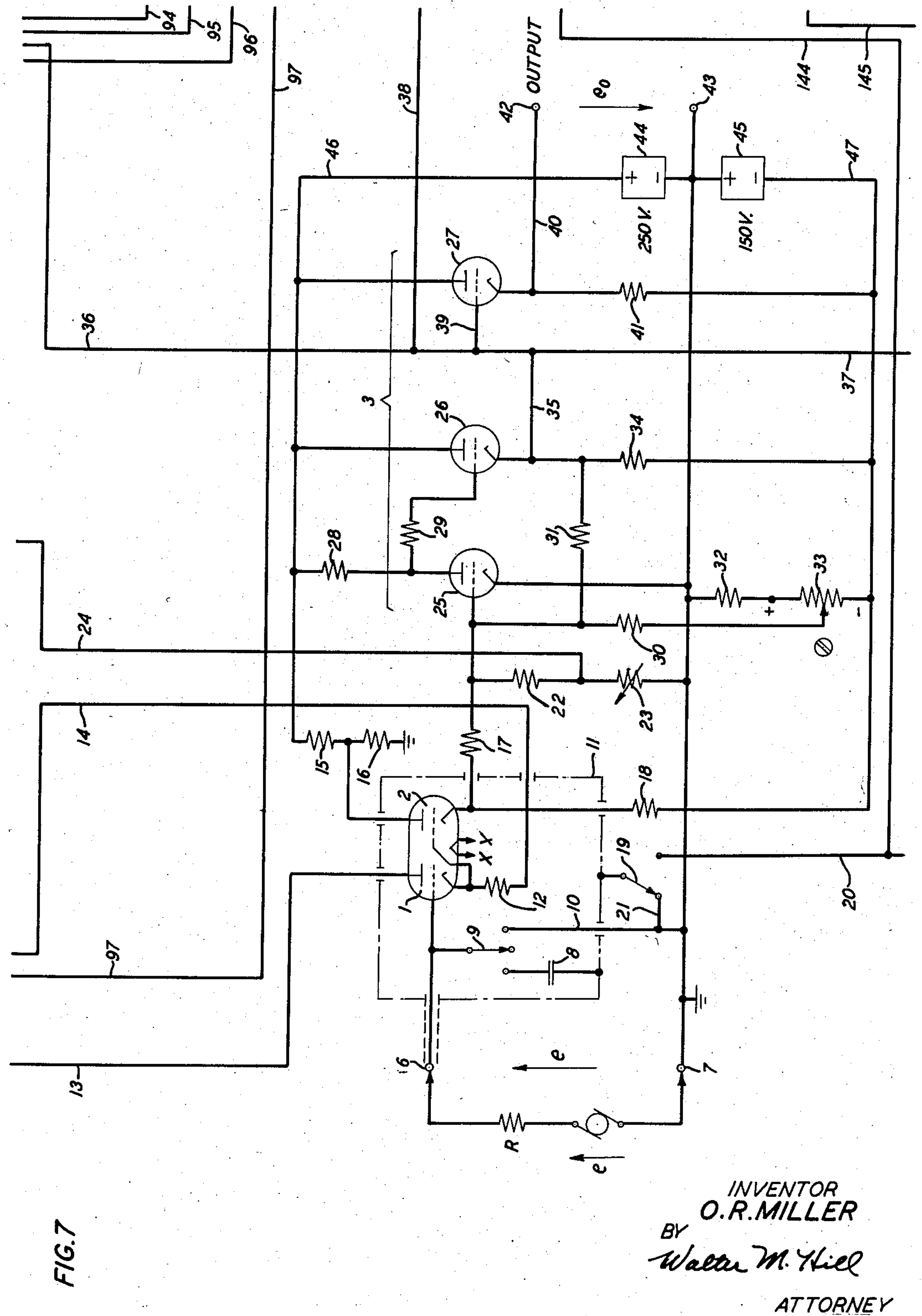

The circuits associated with the drift adjustment potentiometer 98 of Fig. 6 are shown in much more elaborate form than in Fig. 5. For example, a potentiometer 79 with series resistors 80, 81 and 82 are shown associated with the drift control potentiometer unit 83. Potentiometer 79 is provided for balancing the potential outputs between the two potentiometers 83 and 88 of the drift control 98. This balancing adjustment is made by connecting an external meter, not shown, between the anode of tube 50 and ground. Switch 139 of Fig. 9 is set on position N and switch 9 is operated to ground. Then, with drift control 98 centered, potentiometer 79 is adjusted until the external meter will show no change when drift control 98 is moved.

This circuit also shows three compensation networks to overcome second order effects caused by adjusting either the drift control 98 or the input resistance control 52, both of which are shown in Fig. 6.

The first of these compensation networks comprises resistors 85 and 86 connected between the slider of potentiometer 88 and conductor 67 which is connected to the negative terminal of power supply 45. A conductor 24 leads from the junction of these two resistors to the junction between two other series-connected resistors 22 and 23 in Fig. 7. Resistors 22 and 23 are connected between the grid of tube 25 and ground. It will be noted that resistor 23 is shown variable. In practice this resistor may be fixed after having once been properly selected in the initial alignment. The purpose of this network is to overcome a slight change in output voltage of amplifier 3 due to moving the slider of potentiometer 88. It should be remembered that the drift control 98 is provided for the purpose of correcting the slight drifts in the potentials of the anode and cathode of tube 51. When the drift control 98 is moved from its initially adjusted position, it injects a small change of potential between the grid and cathode of tube 51. It will be noted that when this control is moved the slider of potentiometer 83 changes its potential in a sense opposite from that of the slider of potentiometer 88 and that these two sliders are connected to the grid and cathode of tube 51 through resistors 77 and 89, respectively. When the cathode potential of tube 51 is changed, the anode potential of tube 1 changes with it by reason of the direct connection through conductor 13. An equal potential change is also applied to conductor 14 connected to the cathode through resistor 12. This tends to cause a still smaller change in the output voltage of amplifier 3 which is corrected by a very small compensating potential transmitted over conductor 24 to the grid of tube 25 to prevent a change in the output voltage of amplifier 3.

A second compensating network comprises resistors 135, 140 and 143 which are connected, respectively, to the input grid of the voltmeter in Fig. 9, to the output of amplifier 3 by way of conductor 38 and to a point in the potential dividing network across regulator tube 61 in Fig. 6 by way of conductor 97. This compensating network renders the meter deflection independent of any input resistance adjustment made by potentiometer 52.

When a voltage is applied to the input terminals 6 and 7, the anode and cathode potentials of tube 1 will change proportionally and in the same direction as their grid voltage. Meter 126 should read this applied voltage and it is desired that when potentiometer 52 is moved to adjust the input resistance, it will not change this meter reading. The nature of this error and its compensation may be better understood by a more complete explanation of this circuit operation.

When the grid of tube 1 is at ground potential, conductor 97, connected to the junction of resistors 62 and 63, will also be at or near ground potential. Likewise, conductor 38, connected to the output of amplifier 3, is also at or near ground potential. The fact that conductors 97 and 38 may not be at ground potential when the grid of tube 1 is grounded is of little consequence because the meter is brought to zero by adjusting potentiometer 130. Now if a voltage is applied between terminals 6 and 7, the feedback through amplifier 4 will cause conductor 97 to change potential by exactly the same amount, assuming that potentiometer 52 is at its infinite resistance position. At the same time conductor 38 will change potential by about this same amount but in the opposite sense by reason of the inverter action of tube 25. Meter 126 will read the applied voltage.

Assume now that, while the voltage is applied between terminals 6 and 7, the input resistance potentiometer 52 is moved. This will cause a small shift in the potentials of conductor 97 and of conductors 13 and 14, connected, respectively, to the anode of tube 1 and to its cathode through large resistor 12. The direction of this shift will be determined by the direction that potentiometer 52 is moved. For example, if the adjustment of the input resistance is toward the positive side caused by moving the slider of potentiometer 52 downwardly, the potentials of conductors 97, 13 and 14 will lower very slightly. Due to a slight increase in current through resistor 12, the cathode potential of tube 1 will lower very much less than the anode potential. Consequently, the potential of conductor 38 increases only very slightly but enough to cause an undesirable change in meter deflection. Thus, a movement of potentiometer 52, while a voltage is applied to the input terminals 6 and 7, causes a small shift in the potential of conductor 97 and a still smaller potential shift of opposite sense of conductor 38, the latter resulting in a change in the meter reading.

This is compensated by the networks 135, 140 and 143 connected as previously described. The potential change at the junction of resistors 140 and 143 is proportional to the difference between the potential changes of conductors 38 and 97. Resistor 135 connects this junction to the grid of the meter tube 120 and this resistor is so selected that the meter shows no change as potentiometer 52 is moved while a voltage is applied to the input terminals 6 and 7.

A third compensating network comprises resistors 132 and 133 in Fig. 9 and resistor 84 in Fig. 6. Resistors 132 and 133 are serially connected between conductor 146 and the grid of tube 121. The junction between these resistors is connected to the slider of potentiometer 83 in Fig. 6 through conductor 96 and resistor 84. The purpose of this network is to prevent changes in the meter reading which would otherwise occur because the second network comprising resistor 135 is connected to the anode-cathode circuit of tube 51 so that as the drift control network 98 is operated to change the potentials of the anode and cathode of tube 51, the meter would produce a false deflection due to a change of potential on the grid of tube 120 in the meter circuit. This is corrected by introducing a corresponding change on the grid of tube 121 through this third compensating network connected to the slider of potentiometer 83.

The circuits as thus described in Figs. 6 to 9 inclusive may be adjusted for operation by the following alignment and adjusting procedure. Test switch 139 in the meter circuit of Fig. 9 should be placed on position A, thus grounding the input grid of the voltmeter. The meter is then adjusted to zero by means of potentiometer 130 which is arranged preferably for a screw-driver adjustment as symbolically indicated in Fig. 9.

Switch 139 should then be moved to position B, thus placing a ground on the grid of tube 50 in Fig. 6 by way of conductor 95 and switch brush 138. Switch 9 of Fig. 7 should then be switched to ground so as to ground the grid of tube 1. Amplifier 3 is zeroed by adjusting potentiometer 33 of Fig. 7 until the meter reads zero. It will be noted that switch brush 137 has connected the input grid of the voltmeter to conductor 36 of amplifier 3 by way of conductor 38 and conductor 36 in turn is connected to the cathode of tube 26 by way of conductor 35. Consequently, when this adjustment has been made the cathode of tube 26 is brought to ground potential. The drift control 98 of Fig. 6 should then be centered and switch 9 in Fig. 7 opened to remove the ground from the grid of tube 1. This will very likely result in a deflection of the voltmeter which should be returned to zero by adjusting potentiometer 73 in Fig. 6. This adjustment changes the static bias on the grid of tube 51, thus changing the potential of its cathode with respect to ground and, consequently, the potentials of the anode and cathode of tube 1.

Because of the interaction which existed between the several adjustments, which have just been described, it may be found necessary to repeat them two or three times until no further adjustments are necessary as evidenced by the meter remaining at zero.

The next step in the alignment procedure is to move test switch 139 to position C. It will be noted that the grid of tube 50 of Fig. 6 will remain grounded through the same circuit as before and that the voltmeter input circuit is connected to the anode of tube 50 by way of conductor 94 and a network comprising resistors 141 and 142. Switch brush 137 is connected to the junction between the two latter resistors. The voltmeter will thus indicate a voltage which has been derived from the anode of tube 50. The actual value of this voltage has no significance whatever and it is merely noted and used as a means for reestablishing the same anode potential on tube 50 in the next alignment step.

Test switch 139 is now moved to its position D, thus removing the ground from the grid of tube 50. The voltmeter input circuit, however, is still connected through the same network to the anode of tube 50. Switch 9 of Fig. 7 should be connected to ground so as to again ground the grid of tube 1, after which potentiometer 92 of Fig. 6 should be adjusted until the meter reads the same anode potential on tube 50 as before. It will now be noted that, by reason of the prior adjustments, both conductor 36 and the grid of tube 50 are at ground potential. This is because the grid of tube 50 must be at ground potential in order to permit the anode of tube 50 to return to its original potential. Consequently, there is no current flowing through either gain control 59 or through gain control 52 so that either of these gain controls may now be adjusted without changing the output voltage of amplifier 4, provided, of course, the grid of tube 1 is maintained at ground potential.

The adjustments thus far made are such as to insure that the grid of tube 1 is carrying no current while it is connected to ground. The gain of amplifier 3 is so constructed as to provide approximately unity gain between the grid of tube 1 and the cathode of tube 26 and this is accomplished during construction by so selecting feedback resistor 31 as to establish this condition. The gain of amplifier 4 is adjusted by control 59 so that, with potentiometer 52 set at its midpoint, there is unity gain from the input on grid of tube 1 to its anode. Consequently, as a small signal voltage is now applied between the grid of tube 1 and ground, no grid current should flow in this circuit. The grid is then said to have an infinite resistance which corresponds with the mid position of gain control potentiometer 52 of Fig. 6.

It will now be evident that as potentiometer 52 is moved downwardly, so as to reduce the output voltage of amplifier 4, the anode and cathode of tube 1 do not quite follow the change in voltage on its grid and consequently grid current will flow in the direction of the applied potential. The amount which flows will be determined by the reduction in gain of amplifier 4 by reason of having readjusted the slider of potentiometer 52. Consequently, potentiometer 52 may be calibrated in terms of a positive input grid resistance. Conversely, it will be observed that as this slider of potentiometer 52 is moved upwardly from its infinite resistance position, the gain of amplifier 4 is increased beyond that required for an infinite input resistance condition and will result in causing current to flow in the grid circuit of tube 1 against the applied potential, thus causing the grid circuit to appear to have a negative resistance. This portion of potentiometer 52 may be similarly calibrated in terms of negative input resistance.

Amplifier 5 of Fig. 8 is aligned very simply by moving test switch 139 to position E thereby grounding the grid of tube 100 by way of conductor 145 and brush 138. The meter circuit is also connected to the output cathode of tube 101 in amplifier 5 by way of conductors 144 and 20. With switch 9 in Fig. 7 again returned to its ground position, thus grounding the grid of tube 1, potentiometer 113 in Fig. 8 is adjusted until the voltmeter reads zero. This establishes the zero condition for amplifier 5 so that its output cathode will be at ground potential when its input grid is at ground potential.

Test switch 139 is then moved to position F. In this position the voltmeter is still connected to the cathode of tube 101 but the ground has been removed from the grid of tube 100. The meter should still show no deflection since conductor 37, leading from the cathode of tube 26 by way of conductor 35, is also at ground potential. The gain of amplifier 5 is adjusted by connecting an external source of known voltage on the grid of tube 1. A variable resistor 109 in the feedback path of the amplifier is then adjusted until the meter reads the same known voltage, thus establishing the condition of unity gain through amplifier 5.

The frequency response of the apparatus as disclosed in Figs. 6 to 9 inclusive has been found to be very good between zero to thirty kilocycles per second with the source connected directly to the input circuit of this amplifier. This amplifier may be coupled between a source of most any internal impedance and any kind of utilization circuit. The greatest utility for this invention has been in the field of measurements, although it is not limited to that field.

With the potentiometers 52 and 102 calibrated in the manner previously described and with the apparatus adjusted as set forth above, it is evident that the resistive and capacitive components of the input impedance may be adjusted to most any high value. It is obvious that this invention is suitable to a great many measurement applications, particularly where the source has a very high internal impedance. It is possible to compensate for the leakage resistance of a test cable or other circuit structure which is connected across the terminals of a source which also has an appreciable internal impedance for such measurements. As this leakage is largely resistive, it is compensated by simply adjusting potentiometer 52 to an equal amount of negative resistance. A capacitive component is similarly substantially eliminated by properly adjusting potentiometer 102.

A few of the uses to which this invention has been put may be cited to illustrate its capabilities. During the study of a photocell type of output system for use in the telephone plant it became evident that a static charge was accumulating on the outer surface of a small cold cathode gas-filled discharge tube. This caused the tube to fire prematurely. By connecting a small condenser type probe having a diameter of approximately 5/32 inch to the input circuit of the amplifier of this invention through a shielded cable, these static charges were readily measured. Notwithstanding the fact that the cable had a length of 20 inches, the effective input capacitance was reduced to the order of one micro-microfarad. In this measurement the input resistance, including the test cable, was made substantially infinite.

In another application of this invention the static potential of an electret, comprising a quantity of wax one inch in diameter and having a thickness of 3/8 of an inch, was measured and found to have a potential of 2,630 volts. The measurement was considered correct to within 20 volts. An attempt to measure this potential by directly applying the above-described probe to the electret resulted in the surface voltage being reduced by more than 60%. The potential of the electret was successfully measured by balancing the electret potential against a known voltage and using the probe as a sensitive null detector. The results agreed very favorably with the estimated potential based upon accepted theory.

Other kinds of measurements have also been made with this apparatus including measurements of high resistances in the order of a million megohms, peak voltage measurements, the measurements of the charge on small condensers and small current measurements.

Having thus described the invention and certain particular embodiments thereof, it will become evident to those skilled in the art that certain modifications may be made without departing from the scope of the invention. One of the prime requirements to the successful practice of this invention is that means must be provided for establishing a desired grid current condition for the input stage of the amplifier and means must be provided for maintaining this established condition by automatically driving both the anode and cathode potentials throughout a reasonable range of signal voltages.

What is claimed is:

1. Means for establishing a predetermined input impedance for an amplifier comprising an amplifier having a plurality of stages, the first stage whereof comprising an electron discharge device, an anode, a cathode and a control electrode in said device, an output circuit for said amplifier, and means comprising a feedback circuit in said amplifier including a signal circuit path from said amplifier output circuit to both said anode and said cathode for driving said anode and cathode through substantially equal potential changes proportional to and in the same direction as an input signal potential applied to said control electrode, said amplifier and feedback circuit being capable of providing said amplifier with an overall voltage gain both equal to and exceeding unity.

2. The combination of claim 1 and means in said feedback circuit for controlling the amount of its feedback, whereby the amount of input resistance may be controlled.

3. The combination of claim 1 and an eletrostatic shield substantially surrounding said device.

4. The combination of claim 1 and an electrostatic shield substantially surrounding said device, a second feedback circuit in said amplifier and means connecting said second feedback circuit to said shield whereby the shield potential is also driven proportional to the potential of said control electrode to reduce the amount of input capacitance.

5. The combination of claim 4 and means in said second feedback circuit for controlling the amount of its feedback, whereby the amount of input capacitance is controlled.

6. Means for establishing a predetermined input resistance for an amplifier comprising a vacuum tube having an anode, a cathode and a control electrode, an isolated source of fixed potential difference, a resistor connected between the negative side of said source and said cathode, means connecting the anode to the positive side of said source, an input circuit for said tube comprising said control electrode and a conductor of reference potential, an amplifier having an input circuit and on output circuit with said conductor common to both circuits, means connecting the amplifier input circuit to said cathode, means connecting the amplifier output circuit directly to said source of fixed potential, whereby the potentials of the system comprising said source, said anode and said cathode are caused to vary in the same sense as a potential applied to said control electrode, and means for fixing the gain of said amplifier to establish said predetermined input resistance.

7. Means for establishing a predetermined input resistance for an amplifier comprising a vacuum tube having an anode, a cathode and a control electrode, an isolated source of fixed potential difference, a resistor connected between the negative side of said source and said cathode, means connecting the anode to the positive side of said source, an input circuit for said tube comprising said control electrode and a conductor of reference potential, an amplifier having an input circuit and an output circuit with said conductor common to both circuits, means connecting the amplifier input circuit to said cathode, means connecting the amplifier output circuit directly to said source of fixed potential, an impedance, means connecting said impedance between said source and said conductor whereby the potentials of said source, said anode and said cathode are caused to vary in the same sense as a potential applied to said control electrode, and means for fixing the gain of said amplifier to establish said predetermined input resistance.

8. Means for establishing a predetermined input resistance for an amplifier comprising a vacuum tube having an anode, a cathode and a control electrode, an isolated source of fixed potential difference, means including a resistor connected to said cathode for connecting the anode and cathode across said source, an amplifier having an input circuit and an output circuit, means connecting said input circuit to said cathode, means connecting the amplifier output circuit directly to said source of fixed potential, whereby the potentials of the system comprising said source, said anode and said cathode are caused to vary in the same sense as a potential applied to said control electrode, and means for fixing the gain of said amplifier to establish said predetermined input resistance.

9. Means for establishing a predetermined input impedance for an amplifier comprising an amplifier having a plurality of stages, the first stage whereof comprising a vacuum tube having an anode, a cathode and a control electrode, an isolated source of fixed potential difference, means connecting said source across said anode and said cathode, an input terminal for said amplifier connected to said control electrode, an output circuit for said amplifier, and a positive feedback path for said amplifier coupling the output circuit thereof to both said cathode and said anode, said path including means for simultaneously driving said anode and said cathode through substantially equal potential excursions in response to a signal applied to said control electrode, said amplifier and feedback path being capable of providing said amplifier with an overall voltage gain both equal to and exceeding unity.

10. The combination of claim 9 and an additional amplifier connected in said feedback path, said amplifier having means for adjusting its voltage gain, whereby the input resistance component of said first-named amplifier is rendered adjustable.

11. The combination of claim 9 and an electrostatic shield surrounding said first stage, a second positive feedback path coupling said output circuit to said shield and a means for varying the voltage gain of said second feedback path whereby the input capacitance component of said first-named amplifier is rendered adjustable.

12. The combination of claim 9 and an additional amplifier in said feedback path comprising a vacuum tube having a plurality of electrodes, said amplifier being subject to small amounts of drift, and means for adjusting the potentials between two of the electrodes in said vacuum tube to correct for said drift.

References Cited in the file of this patent

UNITED STATES PATENTS

| | | |
|---|---|---|
| 2,170,050 | Gandtner | Aug. 22, 1939 |
| 2,273,143 | Roberts | Feb. 17, 1942 |
| 2,435,331 | Street | Feb. 3, 1948 |
| 2,483,410 | Grieg et al. | Oct. 4, 1949 |
| 2,489,272 | Daniels | Nov. 29, 1949 |
| 2,508,586 | Veneklasen | May 23, 1950 |
| 2,577,461 | Greefkes et al. | Dec. 4, 1951 |
| 2,623,996 | Gray | Dec. 30, 1952 |
| 2,624,796 | Saunders | Jan. 6, 1953 |
| 2,638,512 | Bessey | May 12, 1953 |
| 2,721,908 | Moe | Oct. 25, 1955 |
| 2,743,325 | Kaiser | Apr. 24, 1956 |
| 2,746,016 | Schurr | May 15, 1956 |
| 2,777,905 | Kelly | Jan. 15, 1957 |